United States Patent [19]
McLain

[11] 3,724,418
[45] Apr. 3, 1973

[54] SOLDER COATING APPARATUS

[76] Inventor: John H. McLain, 208 Winthrop Drive, Huntsville, Ala. 35801

[22] Filed: Aug. 20, 1971

[21] Appl. No.: 113,044

[52] U.S. Cl. ........................118/69, 118/74, 118/300, 118/429, 118/506, 134/108, 228/37

[51] Int. Cl. ..............................................B05c 11/10

[58] Field of Search......118/506, 429, 423, 724, 419, 118/602, 410, 603, 411, 610, 300, 402, 63, 69; 228/34, 36, 37, 33; 29/503; 134/104, 108, 60, 64; 117/102 L, 102 R, 102 M, 102 A, 64 R, 64 C

[56] References Cited

UNITED STATES PATENTS

| | | | |
|---|---|---|---|
| 850,548 | 4/1907 | Steele | 117/102 M |
| 3,190,527 | 6/1965 | Tardoskegyi | 228/37 |
| 3,207,128 | 9/1965 | Leavitt, Jr. et al. | 118/602 |
| 3,218,193 | 11/1965 | Isaacson | 118/429 X |
| 3,482,755 | 12/1969 | Raciti | 228/37 X |
| 3,491,779 | 1/1970 | McLain et al. | 134/108 X |
| 3,500,536 | 3/1970 | Goldschmied | 228/37 X |
| 3,605,244 | 9/1971 | Osborne et al. | 228/37 X |

*Primary Examiner*—Morris Kaplan
*Attorney*—John H. McLain

[57] ABSTRACT

This invention, relating to the application of a thin uniform coat of hot tin lead solder to the exposed copper circuitry of electrical circuit boards utilizes a fluxing station, a standing wave soldering station, a hot liquid spray leveling station, a hot water spray cleaning station, a high volume air spray drying station and a conveyor for transporting the electrical circuit boards past the afore mentioned stations. The apparatus contains those pumps, motors, tanks, and electrical and hydraulic systems necessary to support the afore mentioned stations, more fully described in the drawing and in the body of the disclosure.

5 Claims, 1 Drawing Figure

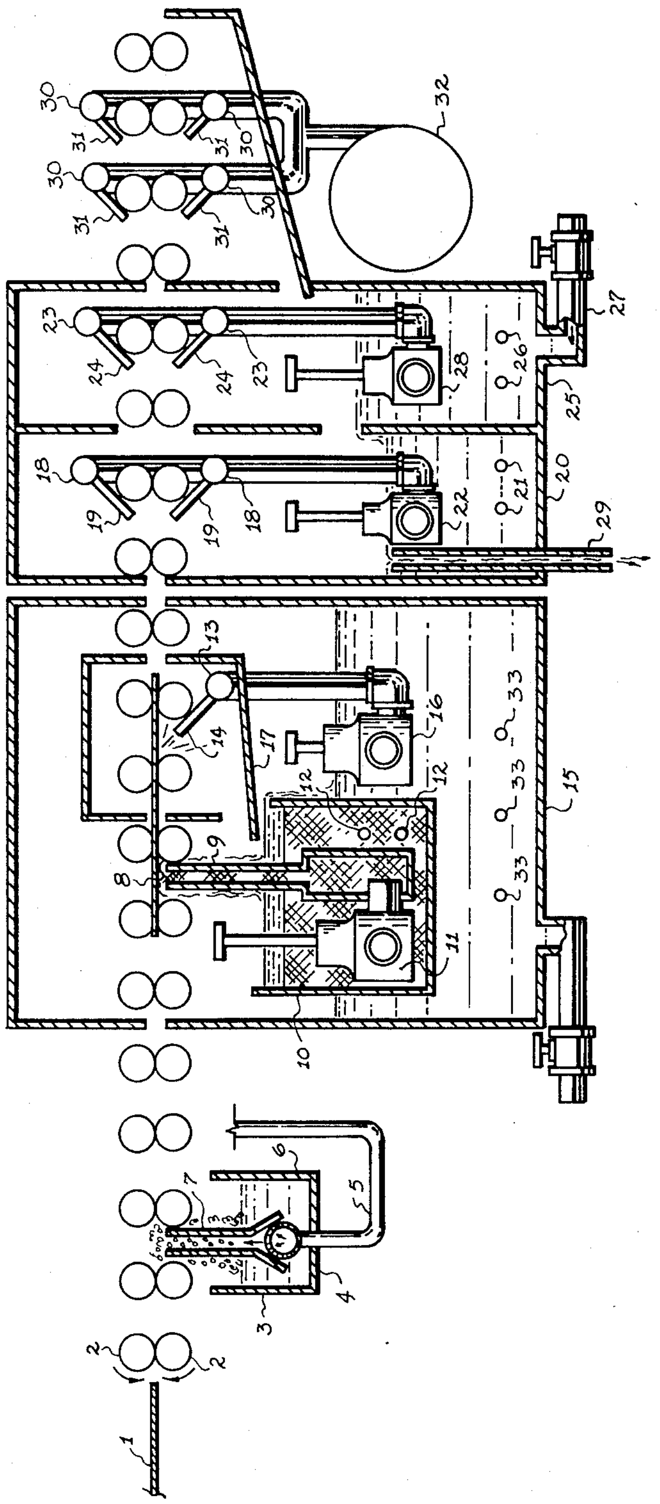
INVENTOR.
John H. McLain

SOLDER COATING APPARATUS

Current methods, such as those described in the teachings of McLain et al., U.S. Pat. No. 3,491,779, utilize an arrangement whereby the solder application is remote from the leveling station. The hot liquid over spray associated with the apparatus described in those teachings precludes the automatic recovery of the excess solder, subject the board to the leveling temperature for a period of time which approaches the total cumulative time allowed by the material suppliers guarantee, and requires that the operator be exposed to a hazardous environment.

The invention described more fully herein eliminates the hot liquid over spray, thus allowing the automatic recovery of the excess solder removed from the electrical circuit board during the leveling operation, reduces the time of exposure of the board to the leveling temperature, and eliminates the danger to the operator.

A primary object of this invention is to develop an improved apparatus for applying a thin uniform coat of hot tin lead solder to the exposed copper surfaces of an electrical circuit board.

Another object of this invention is to develop an improved apparatus for controlling the over spray of the hot liquid used at the leveling station.

Yet another object of this invention is the development of an improved apparatus to reduce the time of exposure of the electrical circuit board to the leveling temperature.

Yet still another object of this invention is the development of an improved apparatus for automatic recovery of the excess solder removed from the electrical circuit board during the leveling operation.

These and other objects of the invention will be more fully understood from the following detailed description and from the accompanying drawing of which:

The sole FIGURE of drawing is a cross section of the assembly, showing the relationship of the stations one to another, the schematic of operation of the individual stations, and the relationship of the roller conveyor to the stations.

In general, the process of this invention is the introduction of an electrical circuit board, comprised of a laminated fiber board with copper conductors, to a solder flux; and thence to a standing wave of hot liquid solder, wherein a thick coat of solder adheres to the exposed surfaces of the copper, by way of an intermetallic bond formed between the solder and the copper; and thence to a hot liquid spray which causes the solder to become remolten and subsequently to remove most of the solder coat by impingement of the hot liquid spray, leaving only a thin uniform coat of solder on the copper; and thence to a hot water spray which removes that water soluble leveling material which has adhered to the surface of the board; and thence to a high volume air spray which removes that water which has adhered to the surface of the board; and thence out of the machine.

Referring now to the drawing, the principal element of the invention is a conveyor which is comprised of opposing rollers 2 which are coated with high temperature silicone rubber. An electrical circuit board 1 is caused by rollers 2 to be conveyed over and into intimate contact with a foam flux 6 which is emitted by a flux tank 3 which is furnished with a porous stone tube 4 which has a stream of air introduced to it from line 5 the source of which is the building supply, not shown. The flux tank 3 is furnished with any good liquid soldering flux 6 in sufficient quantity to cause the porous stone to be fully immersed. The air emitted from the porous stone tube 4 causes the flux to foam and to be guided by the flume 7 toward and into intimate contact with the bottom surface of the electrical circuit board 1. The circuit board 1, which is not coated with flux 6 continues to be conveyed and is caused to pass over and into intimate contact with a standing wave of molten solder 8 which flows through flume 9 from tank 10 by means of pump 11 and back into tank 10. Heaters 12 maintain the solder in tank 10 at a temperature sufficient to cause an intermetallic bond to be formed between the exposed copper of the circuit board 1 and the solder from tank 10. That intermetallic bond causes a thick and irregular layer of solder to adhere to the exposed copper of the electrical circuit board. The circuit board 1 continues to be conveyed and is caused to pass over manifold 13 which is furnished with nozzles 14 which emit a spray of hot liquid leveling agent F at a temperature and a pressure sufficient to cause the afore mentioned solder coat to become molten and to cause the excess solder to be removed from the circuit board. Tank 15, furnished with heaters 17, contains a liquid leveling agent F which is capable of withstanding the temperature necessary for reflowing solder. Leveling agent F, by means of pump 16 is caused to flow through manifold 13 and subsequently through nozzles 14 and then subsequently to impinge onto the surface of circuit board 1, then to continue on until striking rollers 2, is then diffused through out the leveling chamber to be overcome by gravity and to fall into chute 17 which directs it to the surface of the solder in tank 10, and from thence it flows into tank 15. At the time of impingement of the hot liquid leveling agent F onto the surface of circuit board 1, as was mentioned previously, the excess solder is caused to be removed from the surface of circuit board 1 and to flow into chute 17 which directs it to the solder tank 10. The circuit board 1 continues to be conveyed and is caused to pass between manifolds 18 which are furnished with nozzles 19 which emit a spray of hot water, causing the water soluble liquid leveling agent F to be removed from circuit board 1 and to fall into tank 20. Tank 20, furnished with heaters 21, contains water, which by means of pump 22 is caused to flow through manifolds 18 and subsequently through nozzles 19 and then subsequently to impinge onto the surface of circuit board 1 and to fall back into tank 20. The circuit board 1 continues to be conveyed and is caused to pass between manifolds 23 which are furnished with nozzles 24 which emit a spray of hot water which rinses circuit board 1 and then falls into tank 25. Tank 25, furnished with heaters 26, contains water which by means of pump 28 is caused to flow through manifolds 23 and subsequently through nozzles 24 and then subsequently to impinge onto the surface of circuit board 1 and then to fall into tank 25. Water for tank 25 is supplied through pipe 27 from the building supply, not shown. Excess water from tank 25 over flows into tank 20 and then into drain 29. The circuit board 1 continues to be conveyed and is caused to pass between manifolds 30 which are furnished with nozzles 31 which emit a high volume flow of air from blower 32, which volume of air impinges onto the surface of circuit board 1 causing the water to be removed from the circuit board. Circuit board 1 continues to be conveyed and is caused to exit from the machine.

A preferred embodiment of the apparatus is illustrated in the drawing, in which a roller type conveyor causes a circuit board to be conveyed past the flux, wave solder, leveling, cleaning, and drying stations in turn. The flux used may be any good water soluble or rosin base flux. Experience has shown that the hot liquid spray at the leveling station removes any flux residue from the circuit board at the same time that it removes the excess solder. Experience has also shown that the foam application, rather than a spray or flow application, of the flux gives the least amount of machine problems. Any good commercially available foam flux tank and porous stone assembly can be adapted to this general arrangement. While wave soldering apparatus are commercially available which have the same general function as that shown in FIG. 1, none are specifically adaptable to this embodiment. As shown in FIG. 1, the wave soldering tank must be located far enough below the center of board travel to allow the gravity flow of the leveling agent F and the excess solder removed from the circuit board at the leveling station to flow back into the wave soldering tank. Two important benefits are thus derived; 1. The excess solder removed by the leveling operation is returned immediately to the wave soldering tank. 2. the leveling agent F, floating on the surface of the solder in the wave solder tank, serves to prevent the formation of dross.

While solder leveling machines are commercially available, they do not lend themselves to this embodiment. Available machines of the conveyorized type have no method for confining the hot liquid over spray to a small area of the machine. Unless the over spray is controlled, the wave soldering operation must be located remote from the leveling operation, which precludes the automatic recovery of the excess solder which is removed from the circuit board during the leveling operation. The high temperature silicone rubber coated rollers described in this embodiment stop the over spray and redirect it to the confines of the leveling chamber proper, and from there to a chute which routes both the liquid leveling agent and the excess solder to the wave solder tank.

Any good commercially available water washing and drying station of the flat bed conveyor type can be adapted to this embodiment.

What is claimed is:

1. An apparatus for applying a hot tin lead coating of solder to the exposed copper surfaces of an electrical circuit board, said apparatus comprised of a conveyor, the principal elements of which are high temperature silicone rubber coated rollers said rollers arranged in two opposing horizontal rows, with the principal axis of the rollers lying perpendicular to the intended line of travel of the electrical circuit board means for causing the rollers to turn, conveying the electrical circuit board through the length of the assembly, and a foam fluxing station comprising a rectangular tank which lies underneath the conveyor and whose long axis lies perpendicular to the intended line of travel of the electrical circuit board and said tank being filled to a predetermined level with a good quality flux a porous stone tube located under the level of flux in the tank an air hose originating with the building supply and with the outlet end attached to the porous stone tube in a manner which causes air to be emitted out of the stone into the flux, causing the flux to foam a flume located in the center of the said tank and directly over the porous stone tube is such a manner as to guide the foaming flux up to the under side of an electrical circuit board being conveyed by the said roller conveyor, and a wave soldering station comprising a rectangular tank which lies underneath the conveyor and whose principal axis lies perpendicular to the intended line of travel of the electrical circuit board said tank being filled to a predetermined level with a 63–37 tin lead solder heaters capable of maintaining the solder at a temperature sufficient to achieve an intermetallic bond upon introduction of the solder to copper means for pumping the solder through a manifold originating below the level of the liquid solder and terminating at the under side of an electrical circuit board being conveyed by the conveyor, in such a manner that all of the surface of the under side of the electrical circuit board makes intimate contact with the solder, causing the formation of an intermetallic bond between the solder from the tank and the exposed copper surfaces of the electrical circuit board means for the over flow of the hot solder to flow back into the open top of the wave soldering tank, and a solder leveling station comprising a tank lying below the conveyor said tank being filled to a predetermined level with a water soluble liquid leveling agent, such as polyglycol or polyoil, capable of withstanding a temperature sufficient to melt tin lead solder heaters capable of maintaining the leveling agent at a temperature sufficient to melt solder means for pumping the liquid leveling agent through a manifold furnished with nozzles which direct the said leveling agent toward the surface of the electrical circuit board being conveyed by the conveyor, and, in fact, causing that liquid leveling agent to impinge against the surface of the electrical circuit board with a force sufficient to cause the excess solder to melt and be removed from the board means by which both the leveling agent and the excess solder are caused to flow into the open top of the afore mentioned wave soldering tank, where the leveling agent, being lighter than the solder, will float on the surface of the solder while the excess solder from the circuit board will inter mingle with the solder in the tank means for the liquid leveling agent to flow from the top of the wave solder tank back into the leveling tank, and a hot water cleaning station comprising two water tanks lying below the conveyor heaters for heating the water to a predetermined temperature means for pumping the water through manifolds furnished with nozzles which direct the water toward the electrical circuit board being conveyed by the conveyor and in fact causing the water to impinge on the surface of the circuit board, causing the water soluble leveling agent to be removed from the surface of the board means for the water and the leveling agent to flow into the water tanks, and an air spray drying station comprising a high volume air blower which forces air through manifolds furnished with nozzles which cause the air to impinge against the surface of the electrical circuit board being conveyed by the conveyor, causing the water to be removed and causing the board to become dry

2. The apparatus as described in claim 1 wherein the double rollers are arranged in an upper and a lower row, the rollers of the upper row directly above the rollers of the lower row in a one to one arrangement, with the surface of the upper roller touching the surface of the lower roller the rollers in the upper row being geared directly to the rollers in the lower row, so that when looking at the conveyor from the right hand side, after looking in the direction of travel of the board, when the lower roller is caused to turn in a clockwise direction, the upper roller will turn in a counter clockwise direction, causing a circuit board placed between the upper and lower rollers to tend to move along the conveyor or, as it were, through the conveyor.

3. The apparatus as described in claim 2 wherein a double roller is located just ahead of the point at which the spray of hot liquid leveling agent is caused to impinge on the surface of the electrical circuit board which is passing between the rollers the said spray, after impingement on the board, is deflected by the board toward the lower roller and is caused to impinge on the surface of the roller which causes the hot liquid to be deflected back toward the center of the leveling tank.

4. The apparatus as described in claim 3 wherein the actual leveling operation by impingement of a hot liquid against the surface of the electrical circuit board which has been coated with a hot tin lead solder, which impingement is for the purpose of melting and removing the excess solder from the surface of the board, is confined to the space that exists between two of the sets of double rollers, thereby limiting the time in which the board is exposed to the temperature of the hot liquid leveling agent to a period of approximately 3 seconds.

5. The apparatus as described in claim 4 wherein the application of a hot tin lead solder to the exposed copper surfaces of an electrical circuit board is accomplished at a point which lies approximately 4 inches in front of the point at which the excess solder is removed from that board by the impingement of a hot liquid spray, which location allows the automatic recovery and reuse of the excess solder by redirection of the leveling agent and the excess solder into the open top of the wave soldering tank wherein the liquid leveling agent float on top of the solder in the tank and drains back into the leveling tank.

* * * * *